(12) United States Patent
Bronson et al.

(10) Patent No.: US 7,702,972 B2
(45) Date of Patent: Apr. 20, 2010

(54) METHOD AND APPARATUS FOR SRAM MACRO SPARING IN COMPUTER CHIPS

(75) Inventors: Timothy Carl Bronson, Round Rock, TX (US); Garrett Drapala, Poughkeepsie, NY (US); Hieu Trong Huynh, Pflugerville, TX (US); Patrick James Meaney, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 270 days.

(21) Appl. No.: 11/874,282

(22) Filed: Oct. 18, 2007

(65) Prior Publication Data

US 2009/0106607 A1 Apr. 23, 2009

(51) Int. Cl.
*G11C 29/00* (2006.01)
(52) U.S. Cl. .............................. 714/711; 714/5; 714/7; 714/11; 714/41; 714/710; 714/718; 714/723; 714/733; 714/734; 365/201; 711/113; 711/118; 711/119; 711/120; 711/134
(58) Field of Classification Search ....................... None
See application file for complete search history.

(56) References Cited

U.S. PATENT DOCUMENTS

| | | | | |
|---|---|---|---|---|
| 5,530,674 A | * | 6/1996 | McClure et al. ............. | 365/201 |
| 7,099,233 B2 | * | 8/2006 | Chen .......................... | 365/94 |
| 7,437,632 B2 | * | 10/2008 | Marr .......................... | 714/723 |
| 2004/0025095 A1 | * | 2/2004 | Nemani et al. ............... | 714/710 |
| 2006/0026454 A1 | * | 2/2006 | Tonosaki et al. ............... | 714/5 |
| 2007/0168772 A1 | * | 7/2007 | Marr .......................... | 714/710 |
| 2008/0089139 A1 | * | 4/2008 | Ong ...................... | 365/189.08 |
| 2008/0163255 A1 | * | 7/2008 | Munoz et al. ............... | 719/318 |

* cited by examiner

*Primary Examiner*—John P Trimmings
(74) *Attorney, Agent, or Firm*—John E. Campbell; Lynn L. Augspurger

(57) ABSTRACT

SRAM macro sparing allows for full chip function despite the loss of one or more SRAM macros. The controls and data flow for any single macro within a protected group are made available to the spare or spares for that group. This allows a defective or failed SRAM macro to be shut off and replaced by a spare macro, dramatically increasing manufacturing yield and decreasing field replacement rates. The larger the protected group, the fewer the number of spares required for similar improvements in yield, but also the more difficult the task of making all the controls and dataflow available to the spare(s). In the case of the Level 2 Cache chip for the planned IBM Z6 computer, there are 4 protected groups with 192 SRAM macros per group. Each protected group is supplanted with an additional 2 spare SRAM macros, along with sparing controls and dataflow that allow either spare to replace any of the 192 protected SRAM macros.

19 Claims, 10 Drawing Sheets

| | ADDR-ESSES | BITS OR SETS | BITS OR SETS | CELLS/ARRAY | INST/NEST | REPAIR | KCELLS/DOMAIN | DOMAINS | SPARES/DOMAIN | SOFT FAIL/LY | CUM SOFT FAIL | COMMENT |
|---|---|---|---|---|---|---|---|---|---|---|---|---|
| L2 CACHE | 2048 | 12 | 12 | 294912 | 768+8 | WL, BL, SA | 294.912 | 768 | 6*+8 | 100.0% | 100.0% | 93.7% W/O SAR |
| L2D+Cfg+L2K | 2048 | 48 | 1 | 98304 | 120 | WL, BL | 98.304 | 120 | 6 | 100.0% | 100.0% | |
| L2RA+LRU+CL | 2048 | 18 | 1 | 36864 | 26 | WL, BL | 36.864 | 26 | 6 | 100.0% | 100.0% | |
| L2+CHIP | 256 | 96 | 1 | 24576 | 24 | BL | 24.576 | 24 | 2 | 99.8% | 99.7% | |

FIG.1

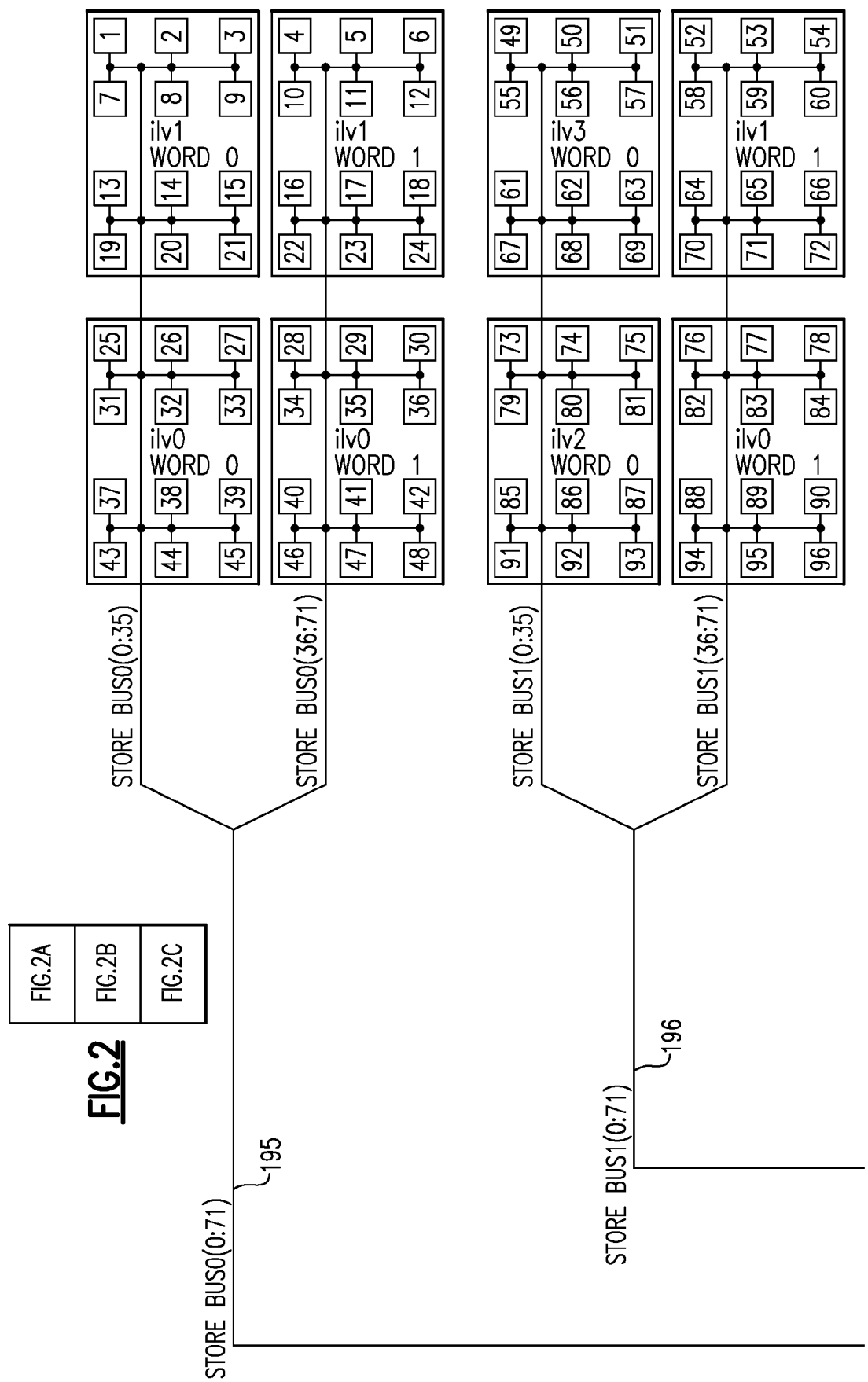

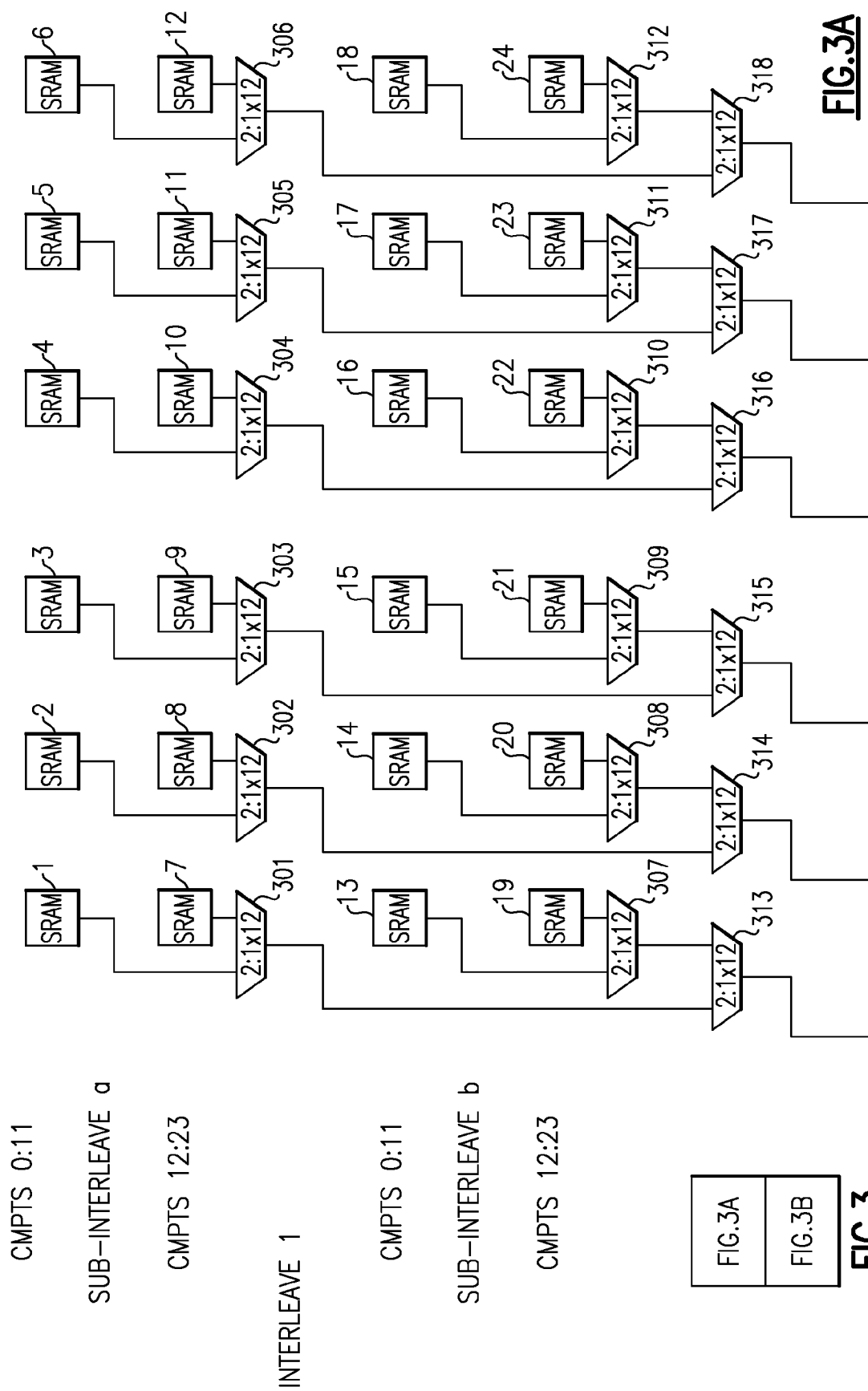

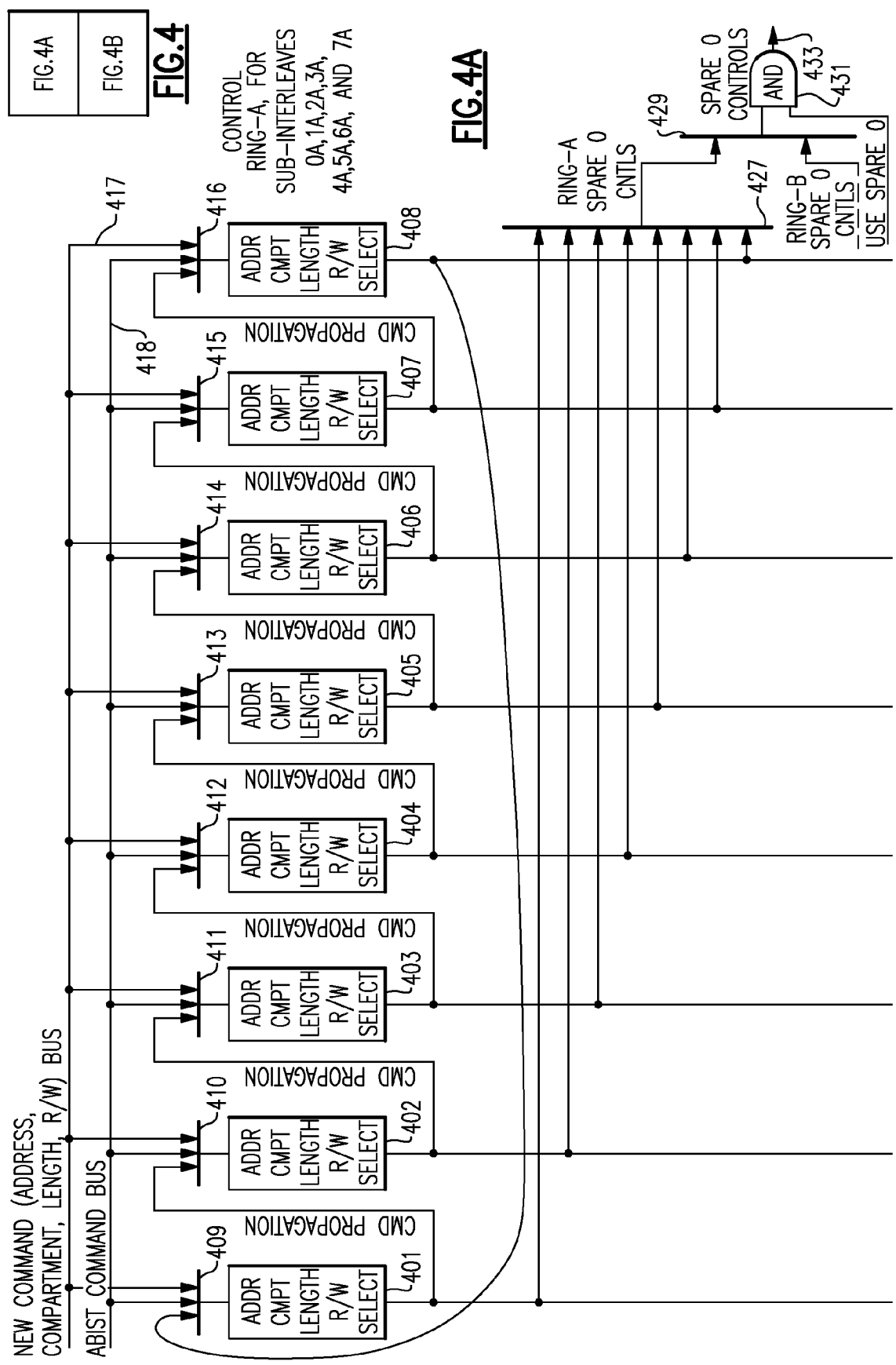

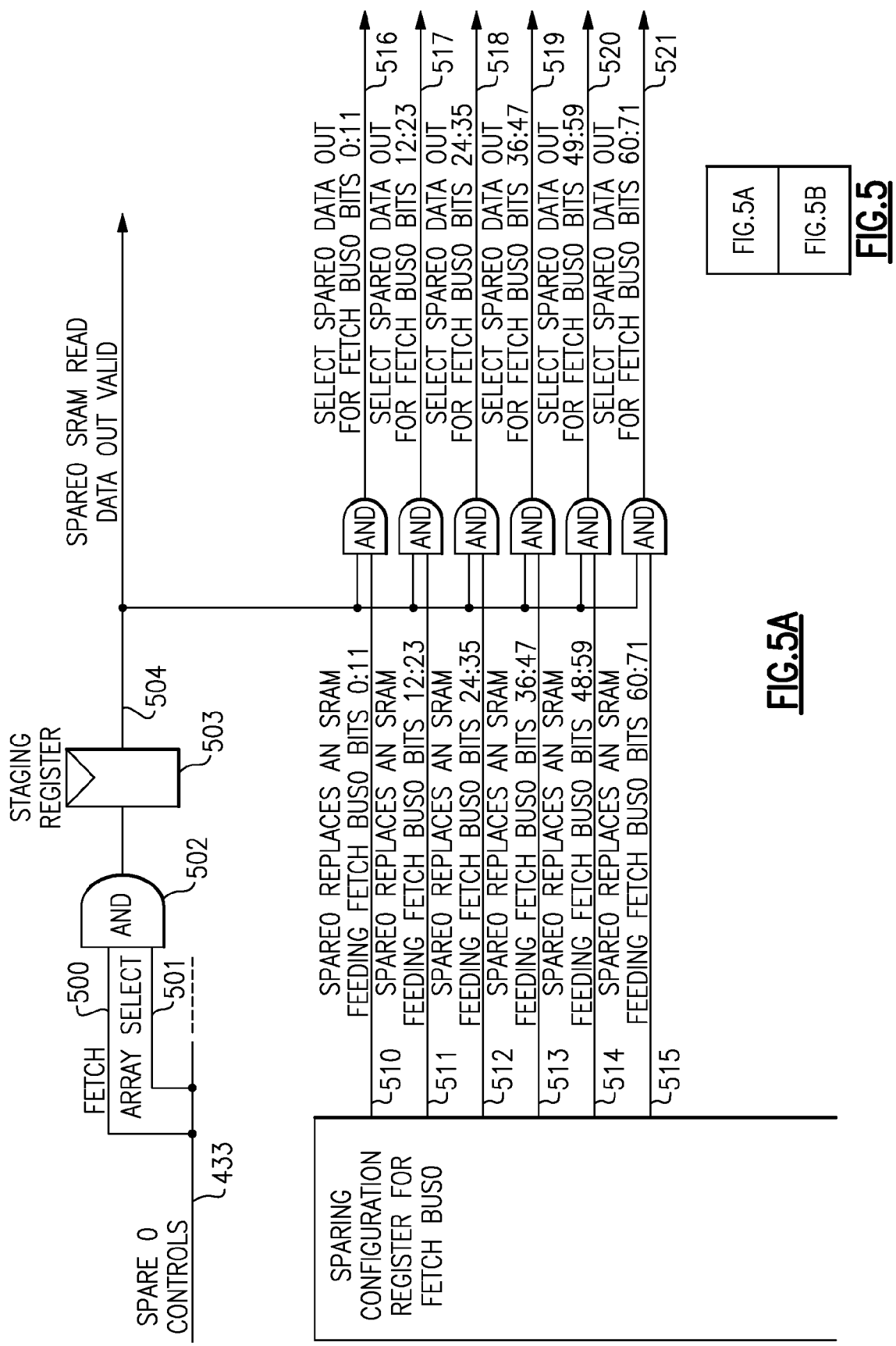

METHOD AND APPARATUS FOR SRAM MACRO SPARING IN COMPUTER CHIPS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to use of embedded SRAM macro's in computer chips, and particularly to the use where the full chip function is maintained despite the loss of one or more embedded S RAM macro's.

2. Description of Background

SRAM (Static Random Access Memory) is commonly embedded in VLSI chips with other computing elements as an alternative to off-chip or stand alone SRAM. SRAM is added to a computer chip as a number of preconfigured SRAM instances. An instance of SRAM is also referred to as an SRAM macro. Each SRAM macro is a collection of static memory elements arranged in rows and columns, and also the associated control circuitry that provides the means to read and write addressable subsets of those memory elements. An SRAM macro typically includes some amount of redundant memory elements that may be used to replace defective memory elements.

Before our invention computer chips that used embedded SRAM's were subject to yield loss and field failures due to defects within the SRAM macros. The manufacturers added redundancy to the SRAM macros in the form of spare bit rows and columns to increase manufacturing yield and as result there was a reduction of the number of field replacements by allowing repair actions that circumvent defects. This approach works well, but its effectiveness diminishes as the percentage of area devoted to embedded SRAM increases. With increasing numbers of macros on a single chip, the likelihood of a single macro depleting all of its built in redundancy increases. This is due in part simply to the increased probability of a random set of defects or fails affecting a single macro, but also due to certain types of fails or defects which may be local in nature and consequently may adversely affect multiple elements of a single macro. Without another layer of redundancy, the loss of a single SRAM macro renders an entire chip unusable or degraded. In the level 2 cache chip for the IBM Z6 (Z6 is a code name for a planned chip for a core processor) computer system, the logical cache will have 768 separate SRAM macros which together account for 201 mm$^2$ of the total chip area of 445 mm$^2$. Pre-production defect and failure rate analysis has shown that redundancy within the SRAM macros alone is not sufficient to produce an acceptable manufacturing yield for this level 2 cache chip.

SUMMARY OF THE INVENTION

The shortcomings of the prior art are overcome and additional advantages are provided through the provision of SRAM macro sparing which allows for full chip function despite the loss of one or more SRAM macros. The controls and data flow for any single macro within a protected group are made available to the spare or spares for that group.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, Macro sparing in accordance with the invention technically allows a defective or failed SRAM macro to be shut off and replaced by a spare macro, dramatically increasing manufacturing yield and decreasing field replacement rates.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1 illustrates a table showing a portion of the yield analysis for the planned IBM z6 chip.

Figure 2B:
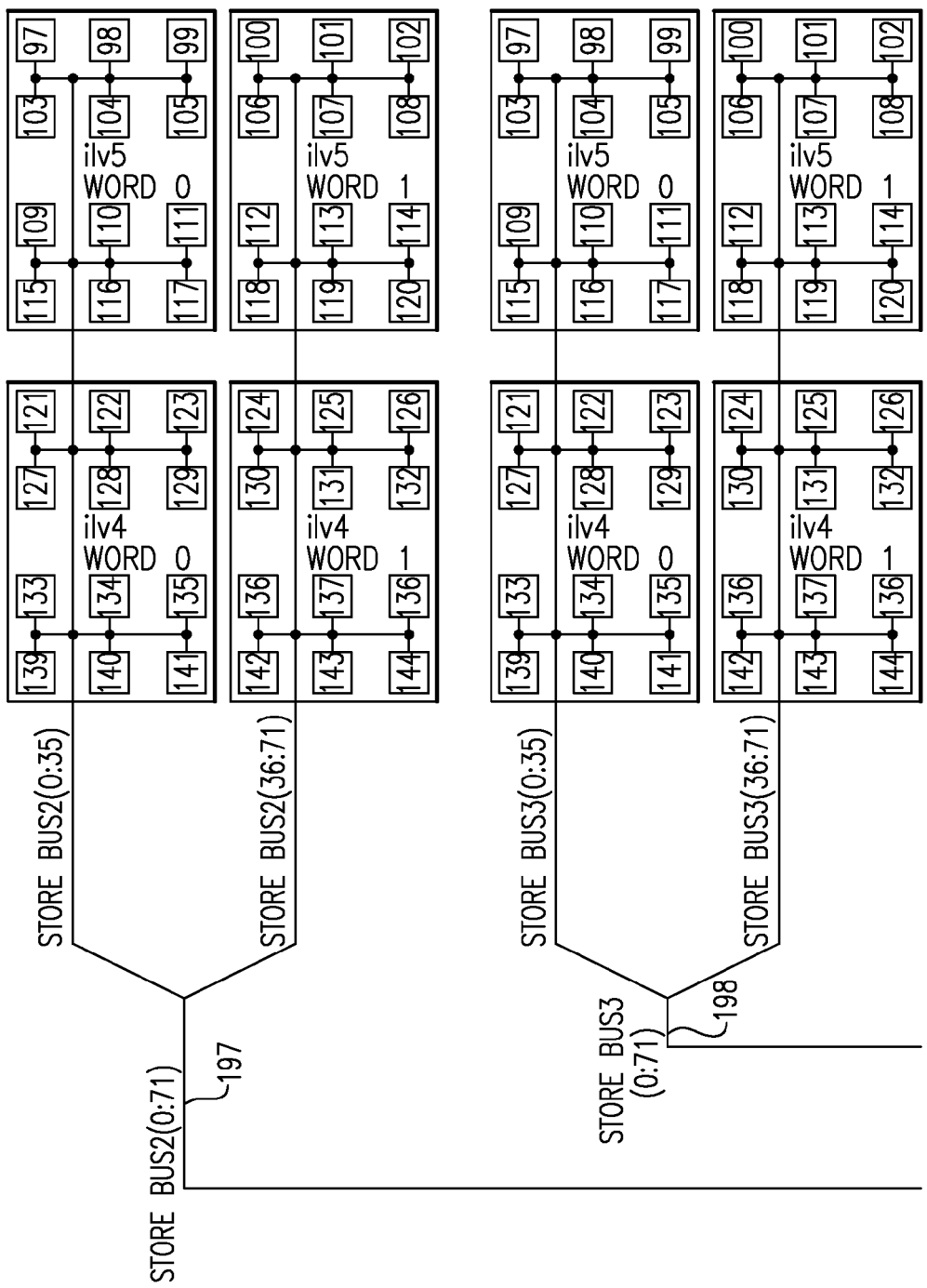
FIG. 2 illustrates the store bus data flow for the IBM Z6 chip and how it is possible to route any portion of any store bus to either to the two spare SRAM macro's.

The detailed description explains the preferred embodiments of the invention, together with advantages and features, by way of example with reference to the drawings.

DETAILED DESCRIPTION OF THE INVENTION

Turning now to the drawings in greater detail, it will be seen in FIG. 1 there a table showing a portion of the yield analysis for the planned IBM z6 chip showing that the addition of SRAM macro sparing feature results in an acceptable manufacturing yield with a minimal area expense (0.47% of the chip area). Without SRAM macro sparing, the chip yield is limited by L2 Cache array fails to 93.7% of what it would be without any arrays present. With the addition of SRAM macro sparing, the chip yield is limited by L2 Cache array fails to 100% of what it would be without any arrays present, or put another way; with SRAM macro sparing, the chip yield is unaffected by projected defects in the L2 Cache SRAM macros.

SRAM macro sparing allows for full chip function despite the loss of one or more SRAM macros. The controls and data flow for any single macro within a protected group are made available to the spare or spares for that group. This allows a defective or failed SRAM macro to be shut off and replaced by a spare macro, dramatically increasing manufacturing yield and decreasing field replacement rates. The larger the protected group, the fewer the number of spares required for similar improvements in yield, but also the more difficult the task of making all the controls and dataflow available to the spare(s). In the case of the Level 2 Cache chip for the planned IBM Z6 computer system, there are 4 protected groups with 192 SRAM macros per group. Each protected group is supplanted with an additional 2 spare SRAM macros, along with sparing controls and dataflow that allow either spare to replace any of the 192 protected SRAM macros.

The SRAM sparing feature of the Level 2 Cache chip (henceforth referred to as the SC (system control) chip for the planned IBM Z6 computer system:

Protects a group of 192 SRAM macros with 2 spare SRAM macros

Steers any of 16 sets of controls to either of 2 spare SRAM macros

Steers any of 24 store data lanes to either of 2 spare SRAM macros

Steers either of 2 spare SRAM macro read data out buses onto any one of the 24 fetch data lanes during the cycle that the data would otherwise have been sourced by a spared (defective) SRAM macro Allows testing of the spare SRAM macros using a single shared Array Built In Self Test (ABIST) engine.

The SC chip of the planned IBM Z6 computer system contains 4 groups of SRAM macros, each of which is protected by an SRAM macro sparing mechanism and 2 spare SRAM macros. Each protected group of SRAM macros is logically divided into 16 interleaves, with 2 banks of 6 SRAM macros per interleave. The main interleave controller sources 16 control buses from 16 sets of control registers. The control buses are comprised of address, read/write, array select, compartment select, and late select signals. In order to allow for either of the 2 spare SRAM macros to replace any of the 192 SRAM macros in a protected group, it is necessary to provide a steering means to connect any of the 16 control buses to either of the 2 spare SRAM macros. This connectivity for the steering is provided by a set of spare control bus multiplexers. The selection controls for the spare control bus multiplexers are derived from the two Spare ID registers which contain the locations of the SRAM macros to be replaced or spared out. The control bus from the ABIST engine can also be multiplexed onto the spare SRAM macro control buses to allow complete testing of the spares without the addition of a dedicated ABIST engine.

Figure 2C:
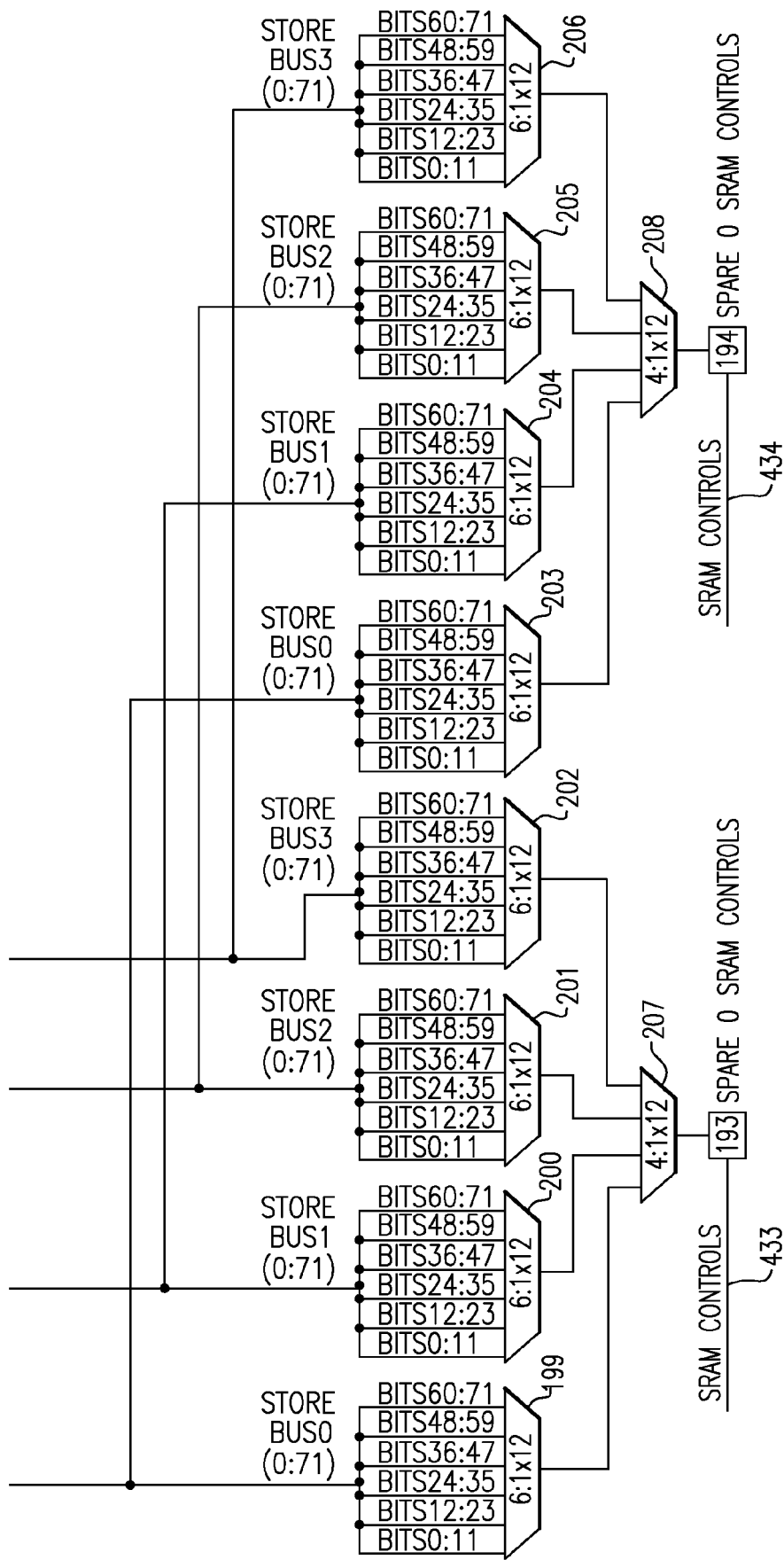

FIG. 2 shows steering store means for the store bus data flow for a spare protected group of SRAM macros 1-192 and their associated spare SRAM macros 193,194. There are 4 logical store data buses: store bus0 195, store bus1 196, store bus2 197, and store bus3 198. Each SRAM macro 1-192 has a data width of 12 bits, consequently each 72 bit store bus can be thought of as being divided into 6 lanes of 12 bits each for a total of 24 store data lanes included in store buses 195-198. The distribution of store data lanes to the SRAM macros 1-192 is a function of the interleaving of cache data and the sharing of store data buses and is specific to the SC chip, but it is not critical to the claims of this invention. The distribution of store data lanes results in some SRAM macros receiving the same store data lanes. For instance, SRAM macros 1,7, 13,19,25,31,37, and 43 each receive bits 0:11 of store bus0 195, SRAM macros 2,8,14,20,26,32,38, and 44 each receive bits 12:23 of store bus0 195, SRAM macros 3,9,15,21,27,33, 39, and 45 each receive bits 24:35 of store bus0 195, SRAM macros 4,10,16,22,28,34,40, and 46 each receive bits 36:47 of store bus0 195, SRAM macros 5,11,17,23,29,35,41, and 47 each receive bits 48:59 of store bus0 195, and finally SRAM macros 6,12,18,24,30,36,42, and 48 each receive bits 60:71 of store bus0 195. Store bus1 196 is similarly distributed to SRAM macros 49-96, store bus2 197 is similarly distributed to SRAM macros 97-144, and store bus3 198 is similarly distributed to SRAM macros 145-192. In order for either of the two spare SRAM macros 193,194 to be capable of replacing any of SRAM macros 1-192, it is necessary to provide a means of routing any of the six 12 bit lanes from any of the store buses 195-198. This means for routing any of the six 12 bit lanes from any of the store buses 195-198 to either spare SRAM macro 193-194 is provided by multiplexers 199-208. Multiplexers 199-202 select 1-of-6 bit lanes for spare SRAM macro 193 and multiplexers 203-206 select 1-of-6 bit lanes for spare SRAM macro 194. Multiplexer 207 selects the store bus 195-198 for spare SRAM macro 193, and multiplexer 208 selects the store bus 195-198 for spare SRAM macro 194. For example, in order to replace SRAM macro 7 using spare SRAM macro 193, multiplexer 199 is set to select bits 0:11 and multiplexer 207 is set to select store bus0 195. This configuration delivers the same store data bits to spare SRAM macro 193 as is delivered to replaced SRAM macro 7. As a further example, in order to replace SRAM macro 30 using spare SRAM macro 194, multiplexer 203 is set to select bits 60:71 and multiplexer 208 is set to select store bus0 195. This configuration delivers the same store data bits to spare SRAM macro 194 as is delivered to replaced SRAM macro 30. The configuration of multiplexers 199-208 is set upon detection of a defective SRAM macro 1-192, and remains static thereafter, it is not required to change from one store operation to another. With regard to ABIST, store buses 195-198 can be supplied with ABIST store data from an ABIST engine (not shown) for the purpose of testing SRAM macros 1-192. Because the spare SRAM macros 193 and 194 receive their store data from some portion of store buses 195-198, they can be driven from the same ABIST engine that is used to test SRAM macros 1-192.

Figure 3B:
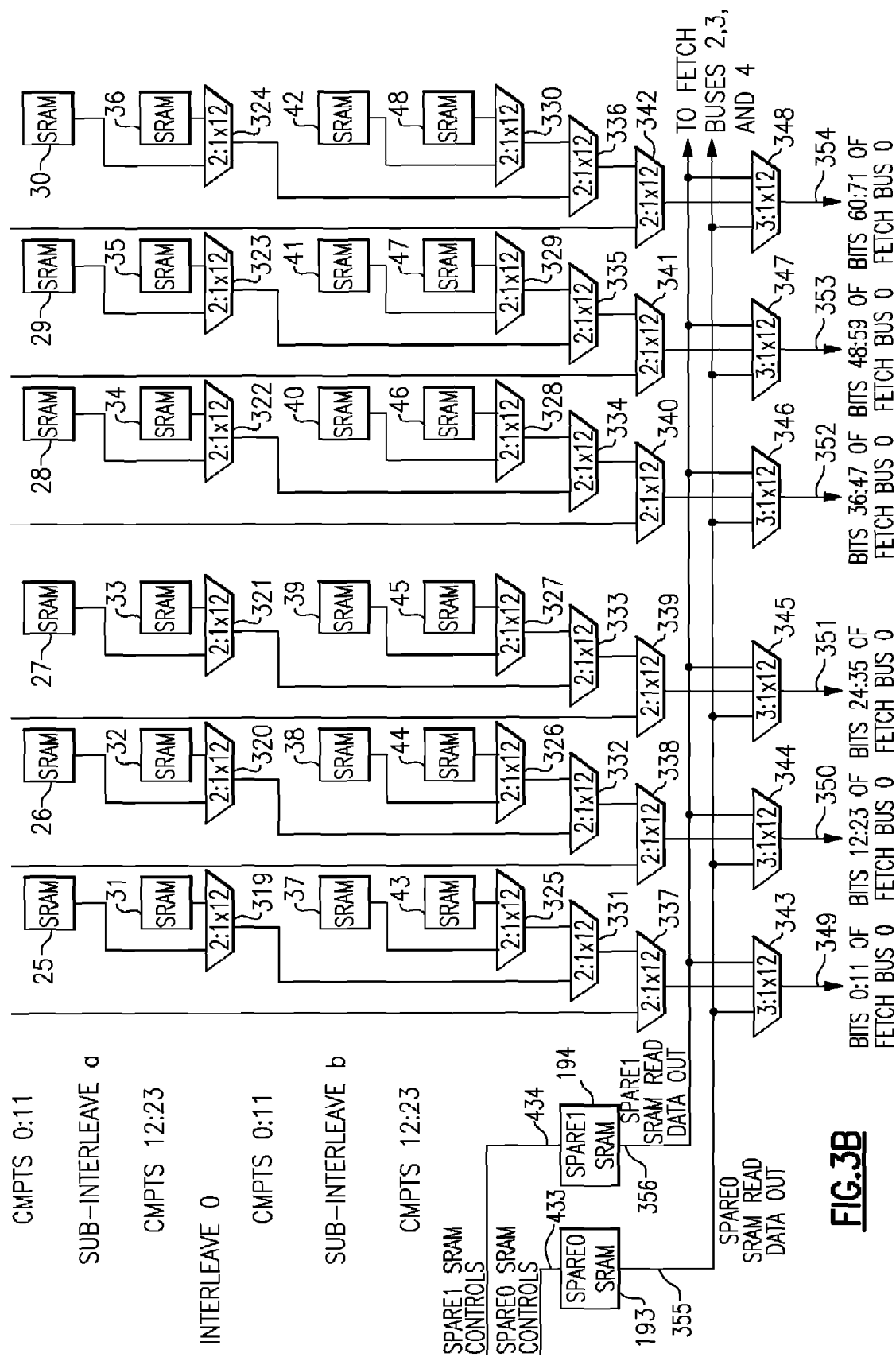
FIG. 3 illustrates the fetch bus data flow for the IBM Z6 chip, showing of one four like buses, and how it is possible to connect the read data out from either spare SRAM macro to any portion of the fetch bus.
Figure 5B:
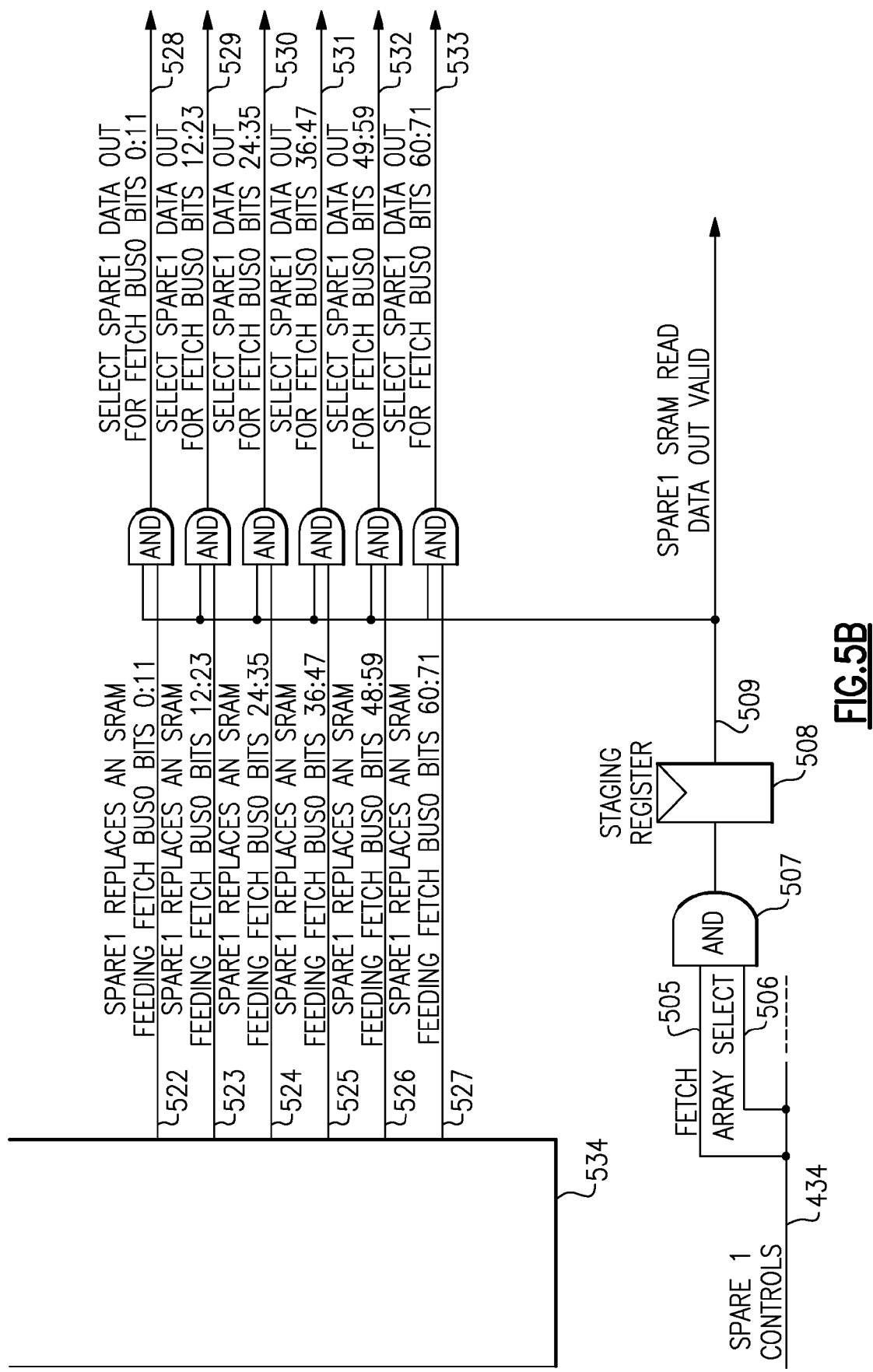
FIG. 5 illustrates the generation of the controls for the fetch data bus multiplexers that select data from a spare SRAM macro instead of a defective SRAM macro as appropriate.

FIG. 3 shows steering read means for the fetch bus data flow for a portion (48 of 192) of a spare protected group of SRAM macros 1-48. There are 4 like logical fetch data buses, only one of which is shown in FIG. 3. Each fetch data bus is comprised of 6 lanes 349-354 with 12 bits per lane. A protected SRAM macro 1-48 is connected to one and only one fetch bus data lane, while either of the 2 spare SRAM macros 193-194 may be connected to any of the fetch data bus lanes through a set of spare fetch data multiplexers 343-348. During normal operation the fetch bus 349-354 is shared by a group of 48 SRAM macros 1-48 in such a way that data is delivered by rows of SRAM macros. For instance, a fetch that involves interleave 0, sub-interleave a, compartment 13, would be sourced from SRAM macros 31-36. The sharing of and data deliver to fetch bus 349-354 is achieved by data multiplexers 301-342. This organization is a function of cache interleaving and fetch bus sharing and is specific to the SC chip, but it is not critical to the claims of this invention. In order for either of the two spare SRAM macros 193,194 to be capable of replacing any of SRAM macros 1-48, it is necessary to provide a routing means for routing their read data out 355 and 356 respectively, to any of the six fetch data lanes 349-354. This routing means for routing 355 or 356 to any of the six fetch data lanes 349-35 is provided by multiplexers 343-348. The controls for multiplexers 343-348 are dynamic, they change from operation to operation. The generation of these controls is shown in FIG. 5. One can see from FIG. 3 that fetch data lane 349 can be sourced from any SRAM macro in the column above, including 1,7,13,19,25,31,37,43. If one of these SRAM macros, say 7 for example, is to be replaced by spare SRAM macro 193, it is necessary that spare fetch data multiplexer 343 selects 193 only when 7-12 are being accessed, at all other times it selects the column or SRAM macro's above via the output of 337. Unless of course a second SRAM macro in said column is replaced by the remaining spare SRAM macro 194. In summary, whenever a spare or replaced SRAM macro from the group 1-48 is accessed for fetch, the appropriate (the one below it) spare fetch data multiplexer 343-348 selects its replacement 193 or 194 instead. The arrangement and fetch multiplexing associated with SRAM macros 1-48 and shown in FIG. 3 is replicated three more times for SRAM macros 49-192, thereby allowing for the sparing of any SRAM macro 1-192 by either spare SRAM macro 193 or 194.

Figure 4B:
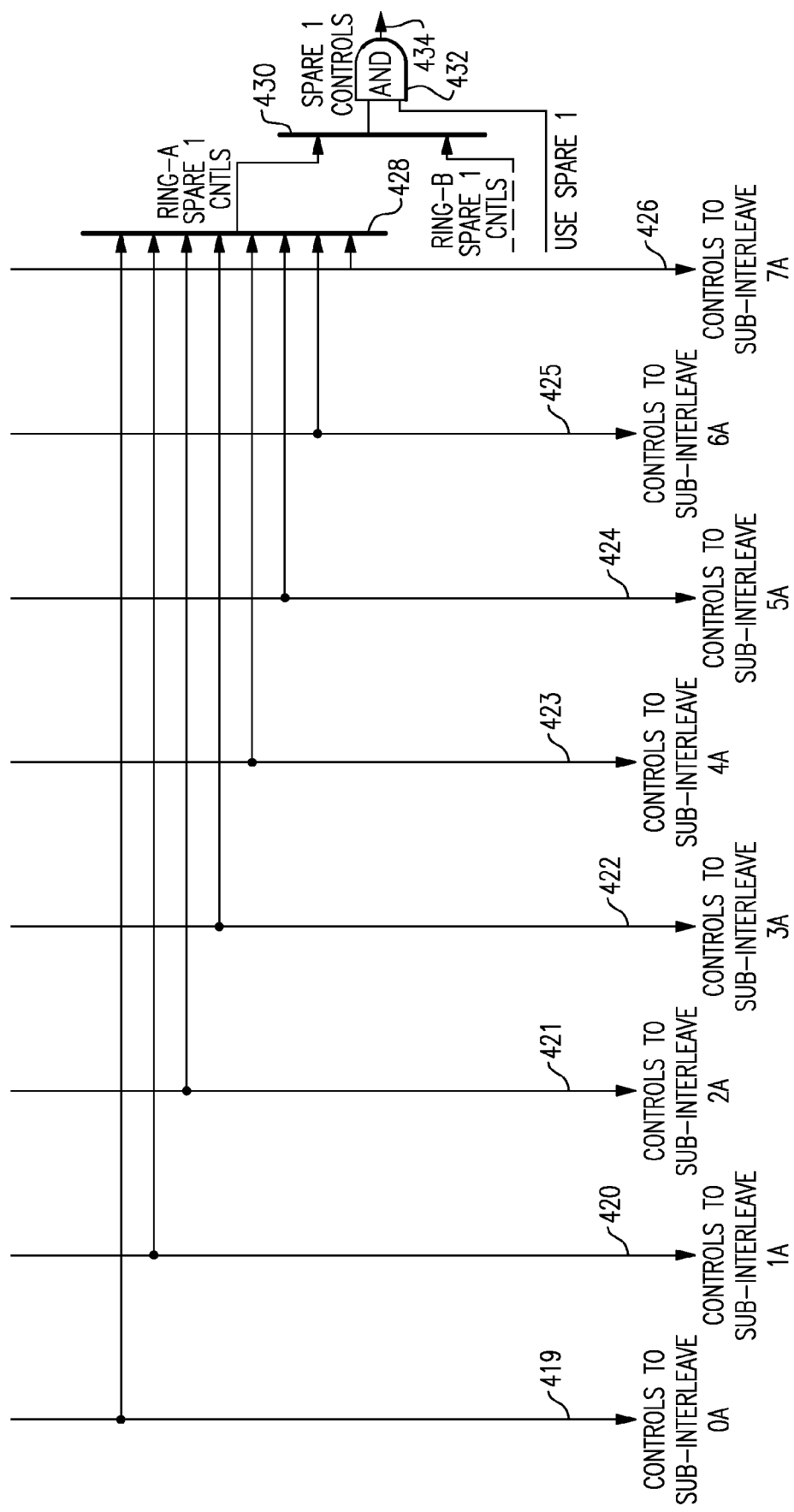
FIG. 4 illustrates the control bus flow for the IBM Z6 chip, and how it is possible to route any of the control busses to either of the two spare SRAM macro's allowing an ABIST engineer to test SRAM macros.

FIG. 4 shows the command propagation for a portion of a group of protected SRAM macros allowing an ABIST engine to test SRAM macros. Accordingly, an Array Built In Self Test (ABIST) engine is connected to all the sets of control buses and all the store data lanes for the purpose of testing the group of protected SRAM macros in the IBM Z6 SC chip. A protected group of 192 SRAM macros is divided into 16 sub-interleaves numbered 0A through 7A and 0B through 7B. Each sub-interleave can be commanded independently, requiring 16 command busses. In order for either of 2 spare SRAM macros 193 or 194 to replace any of the protected SRAM macros 1-192, interleave routing means is provided to route any of the control buses to either spare SRAM macro 193 or 194. FIG. 4 shows the interleave control buses 419-426 for sub-interleaves 0A through 7A. (Not shown is a similar set of interleave control buses for interleaves 0B through 7B, which are represented by sub-interleaves 0A through 7A.) Interleave control buses 419-426 are sourced from interleave controllers 401-408. Interleave controllers 401-408 are connected in a ring, referred to as Control Ring A, by multiplexers 409-416. Not shown is a similar set of interleave controllers and multiplexers, referred to as Control Ring-B, for interleaves 0B through 7B. New commands are received from the main cache controller on bus 417 and placed in the interleave controller associated with the starting interleave of the command. A cache read or write typically traverses multiple interleaves, depending on the length of the command. When a new command is loaded into any interleave controller 401-408 (or the interleave controllers not shown for interleaves 0B through 7B) the length field is also loaded. When an interleave controller 401-408 sends a command on its associated interleave control bus 419-426 respectively, the length is decremented and the command is propagated to the next sequential interleave controller. This command propagation is repeated until the length is depleted. A command that starts in Control Ring-A stays in Control Ring-A and does not enter Control Ring-B (not shown). A command that starts in Control Ring-B (not shown) stays in Control Ring-B and does not enter Control Ring-A. SRAM macro sparing multiplexer 427 selects the contents from 1 of 8 interleave control buses 419-426 depending on which command bus the replaced SRAM macro receives. Not show is a multiplexer which selects from the sub-interleave control buses for sub-interleaves 0B though 7B. Multiplexer 429 selects command bus contents from Control Ring-A or Control Ring-B (not shown) depending on whether the replaced SRAM macro receives its commands from the controllers in Control Ring-A or from the controllers in Control Ring-B (not shown). Multiplexer 429 and the multiplexers that feed it can thus be configured to deliver commands intended for any of the protected SRAM macro's to the input of AND gate 431. And Gate 431 is used to block the controls from reaching spare0 SRAM macro 193 when it is not needed. Spare 0 Controls 433 is connected to spare0 SRAM macro 193, thus allowing for the delivery of commands intended for any of the protected SRAM macros to spare0 SRAM macro 193 also. The multiplexers and connections required to derive Spare 0 Controls 433 are replicated to derive Spare 1 Controls 434. Spare 1 Controls 434 is connected to spare1 SRAM macro 194, thus allowing for the delivery of commands intended for any of the protected SRAM macros to spare1 SRAM macro 194 also. With regard to ABIST, Control Buses 419-426 (and the control buses not shown for sub-interleaves 0B-7B) can be configured to receive commands from the ABIST engine via the ABIST command bus 418 for the purpose of testing SRAM macros 1-192. Because the spare SRAM macros 193 and 194 can receive their controls from any of Control Buses 419-426 (and the control buses not shown for sub-interleaves 0B-7B), they can be commanded from the same ABIST engine that is used to test SRAM macros 1-192. Thus, any of the spare SRAM macros may be tested with the same ABIST engine that is used to test the group of protected SRAM macros.

FIG. 5 shows a set of fetch data bus lanes that are shared by multiple SRAM macros within the group of protected SRAM macros with a detection means for detecting which SRAM macro from within the group of protected SRAM macros is supplying data to any of the shared fetch data bus lanes thereby enabling any of the protected SRAM macros to be replaced by any of the spare SRAM macros that share a set of fetch data bus lanes. T Multiplexer select signals are created for multiplexers 343-348. Portions of Spare0 Controls 433 are extracted to determine when a fetch operation is being sent to spare0 SRAM 193. Specifically, the Fetch signal 500, which indicates Fetch versus Store, and the Array Select signal 501, which indicates a command is valid, are logically AND'ed at 502. The output signal of AND gate 502 is active when a fetch command is presented to spare0 SRAM 193. Staging register 503 delays the output of 502 by the number of cycles required for an SRAM fetch access to complete, thereby generating a signal 504 that is active when spare0 SRAM read data out 355 is valid. Signal 504 then, is a dynamic signal that is active whenever the data from spare0 SRAM 193 is available to replace the data from a spared (defective) SRAM macro. A similar signal 509 is generated for spare1 SRAM 194 using 434, 505 506,507, and 508. Sparing Configuration Register for Fetch Bus0 534 contains static register bits that are connected directly to signals 510-15 and 522-527 and are used to control which fetch bus bits are replaced by the spare SRAM macros 193 and 194. For example, if SRAM macro 7 shown in FIG. 3 were defective and replaced by spare0 SRAM 193, then the signal "Spare0 replaces an SRAM feeding Fecth Bus0 Bits 0:11" 510 would be set. Similarly, if SRAM macro 10 shown in FIG. 3 were defective and replaced by spare1 SRAM 194, then the signal "Spare1 replaces an SRAM feeding Fecth Bus0 Bits 36:47" 510 would be set. Not shown are similar Sparing Configuration Registers for fetch buses 1, 2, and 3. When the static signals 510-515, that indicate which bit lane is to be replaced by spare0 SRAM 193, are logically AND'ed with the dynamic signal 504, that indicates when fetch data is valid from spare0 SRAM 193, the multiplexer selects 516-521 are generated for multiplexers 343-348 respectively. For example, if SRAM macro 7 shown in FIG. 3 were defective and replaced by spare0 SRAM 193, then the signal "Select Spare0 Data Out for Fetch Bus0 Bits 0:11" 516 would be active and would cause multiplexer 343 to select fetch data from spare0 SRAM 193 instead of SRAM macro 7 whenever a fetch command targets the defective SRAM macro 7. Similarly, when the static signals 522-527, that indicate which bit lane is to be replaced by spare1 SRAM 194, are logically AND'ed with the dynamic signal 509, that indicates when fetch data is valid from spare1 SRAM 194, the multiplexer selects 528-533 are generated for multiplexers 343 348 respectively. For example, if SRAM macro 10 shown in FIG. 3 were defective and replaced by spare1 SRAM 194, then the signal "Select Spare1 Data Out for Fetch Bus0 Bits 36:47" 516 would be active and would cause multiplexer 343 to select fetch data from spare1 SRAM 194 instead of SRAM macro 10 whenever a fetch command targets the defective SRAM macro 10. Not shown are multiplexer select signals for fetch buses 1, 2, and 3, but their generation is similar to that shown for 516-521 and 528-533.

The diagrams depicted herein are just examples. There may be many variations to these diagrams or the steps (or operations) described therein without departing from the spirit of the invention. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A computer chip comprising:
   a plurality of chip functional elements, including:
   a group of protected SRAM macros;
   one or more spare SRAM macros;
   a plurality of control buses connected to subgroups of the protected SRAM macros;
   a plurality of store bus lanes connected to subgroups of said group of protected SRAM macros;
   a plurality of fetch bus lanes that are supplied by the read data out from said subgroups of the protected SRAMs;
   steering controls for steering any controls coupled to any of the protected SRAM macros to any of the spare SRAM macros;
   a steering store means of steering any of the store bus lanes connected to any of the protected SRAM macros to any of said spare SRAM macros, and
   a steering read means of steering read data from any of the spare SRAM macros to any of the fetch data bus lanes that are supplied by the read data out of any of the protected SRAM macros,
   whereby any of the protected SRAM macros are enabled to be replaced by any of the spare SRAM macros for continued full chip function of said functional elements despite any loss of one or more SRAM macros.

2. The computer chip of claim 1 wherein an Array Built In Self Test (ABIST) engine is connected to all the sets of control buses and all the store data lanes for the purpose of testing the group of protected SRAM macros.

3. The computer chip according to claim 2 wherein any of the spare SRAM macros may be tested with the same ABIST engine that is used to test the group of protected SRAM macros.

4. The computer chip according to claim 1 further comprising:
   a set of fetch data bus lanes that are shared by multiple SRAM macros within the group of protected SRAM macros;
   a detection means for detecting which SRAM macro from within the group of protected SRAM macros is supplying data to any of the shared fetch data bus lanes;
   thereby enabling any of the protected SRAM macros to be replaced by any of the spare SRAM macros that share a set of fetch data bus lanes.

5. The computer chip according to claim 1 wherein the controls and data flow for any single macro of a single group are made available to one or more spares for said single group.

6. The computer chip according to claim 1 wherein there are four groups of said protected macros each of which is protected by SRAM macro sparing and group of protected SRAM macros and two spare SRAM macros.

7. The computer chip according to claim 6 wherein provided for said functional elements for each group of said protected SRAM macros which is logically divided into 16 interleaves and with two banks of six SRAM macros per interleave, there is provided a main interleave controller which sources 16 control busses from 16 control registers, and control buses which are comprised of address, read/write, array select, compartment select, and late select signals.

8. The computer chip according to claim 7 wherein either of the 2 spare SRAM macros replace any of the 192 SRAM macros in a protected group.

9. The computer chip according to claim 8 wherein said steering controls to connects any of the 16 control busses to either of the 2 spare SRAM macros.

10. The computer chip according to claim 9 wherein connectivity for said steering controls is provided by a set of spare control bus multiplexers.

11. The computer chip according to claim 10 wherein selection controls for said spare control bus multiplexers are derived from two Spare ID registers which contain the locations of the SRAM macros to be replaced or spared out.

12. The computer chip according to claim 11 wherein a control bus from the ABIST engine can also be multiplexed onto spare SRAM macro control buses to allow complete testing of the spares without the addition of a dedicated ABIST engine.

13. The computer chip according to claim 12 wherein a defective or failed SRAM macro is to be shut off and replaced by a spare macro.

14. The computer chip according to claim 13 wherein a fetch signal which indicates a read and an array select signal logically ANDed is presented to a spare register which delays the output of the ANDed signal by a number of cycles required for an SRAM fetch access to complete causing a generative active signal when spare SRAM read out data is valid.

15. The computer chip according to claim 14 wherein static register bits are used to control which fetch bus bits are set by replacement of said spare SRAM macros.

16. The computer chip according to claim 1 wherein connectivity for said steering controls is provided by a set of spare control bus multiplexers.

17. The computer chip according to claim 16 wherein selection controls for said spare control bus multiplexers are derived from two Spare ID registers which contain the locations of the SRAM macros to be replaced or spared out.

18. The computer chip according to claim 17 wherein a control bus from the ABIST engine can also be multiplexed onto spare SRAM macro control buses to allow complete testing of the spares without the addition of a dedicated ABIST engine.

19. The computer chip according to claim 18 wherein a defective or failed SRAM macro is to be shut off and replaced by a spare macro.

* * * * *